(12) United States Patent
Kobayakawa et al.

(10) Patent No.: US 7,674,644 B2
(45) Date of Patent: Mar. 9, 2010

(54) METHOD FOR FABRICATION OF GROUP III NITRIDE SEMICONDUCTOR

(75) Inventors: Masato Kobayakawa, Ichihara (JP); Hisayuki Miki, Ichihara (JP)

(73) Assignee: Showa Denko K.K., Tokyo (JP)

( * ) Notice: Subject to any disclaimer, the term of this patent is extended or adjusted under 35 U.S.C. 154(b) by 106 days.

(21) Appl. No.: 11/662,474

(22) PCT Filed: Sep. 12, 2005

(86) PCT No.: PCT/JP2005/017199

§ 371 (c)(1),
(2), (4) Date: Apr. 25, 2007

(87) PCT Pub. No.: WO2006/030918

PCT Pub. Date: Mar. 23, 2006

(65) Prior Publication Data

US 2008/0076200 A1    Mar. 27, 2008

Related U.S. Application Data

(60) Provisional application No. 60/611,284, filed on Sep. 21, 2004.

(30) Foreign Application Priority Data

Sep. 13, 2004 (JP) .............................. 2004-265333

(51) Int. Cl.
*H01L 21/00* (2006.01)

(52) U.S. Cl. ........... 438/47; 257/E21.386; 257/E21.387

(58) Field of Classification Search .................... 438/47, 438/94, 758, 767, 779; 257/E21.371, E21.387, 257/E21.386
See application file for complete search history.

(56) References Cited

U.S. PATENT DOCUMENTS

| 4,911,102 A | * | 3/1990 | Manabe et al. | 118/719 |
| 5,670,798 A | * | 9/1997 | Schetzina | 257/96 |
| 7,063,741 B2 | * | 6/2006 | D'Evelyn et al. | 117/73 |

FOREIGN PATENT DOCUMENTS

| CN | 1409778 A | 4/2003 |
| JP | 2-229476 | 9/1990 |
| JP | 4-297023 | 10/1992 |
| JP | 8-162417 A | 6/1996 |
| JP | 9-36419 A | 2/1997 |
| JP | 9-64477 | 3/1997 |

(Continued)

OTHER PUBLICATIONS

P. Kung, et al.; "High Quality AlN and GaN epilayers grown on (00-1) sapphire, (100), and (111) silicon substrates"; Appl. Phys. Lett.; vol. 66, No. 22, May 29, 1995; pp. 2958-2960.

*Primary Examiner*—Brook Kebede
(74) *Attorney, Agent, or Firm*—Sughrue Mion, PLLC

(57) ABSTRACT

A method for the fabrication of a Group III nitride semiconductor includes the steps of installing a substrate in a reaction vessel, forming a Group III nitride semiconductor on the substrate, causing a solid nitrogen compound to exist in the reaction vessel as a nitrogen source for a Group III nitride semiconductor and supplying a raw material gas as a source for a Group III element into the reaction vessel to fabricate the Group III nitride semiconductor.

10 Claims, 2 Drawing Sheets

FOREIGN PATENT DOCUMENTS

| | | |
|---|---|---|
| JP | 11-246297 A | 9/1999 |
| JP | 2000-233993 A | 8/2000 |
| JP | 2001-23902 A | 1/2001 |
| JP | 2003-243302 | 8/2003 |
| JP | 2004-247711 A | 9/2004 |
| WO | 00/68470 A1 | 11/2000 |

* cited by examiner

METHOD FOR FABRICATION OF GROUP III NITRIDE SEMICONDUCTOR

CROSS REFERENCE TO RELATED APPLICATIONS

This application is an application filed under 35 U.S.C. §111(a) claiming the benefit pursuant to 35 U.S.C. §119(e)(1) of the filing dates of Provisional Application No. 60/611,284 filed Sep. 21, 2004 and Japanese Patent Application No. 2004-265333 filed Sep. 13, 2004 pursuant to 35 U.S.C. §111 (b).

TECHNICAL FIELD

This invention relates to a Group III nitride semiconductor excelling in crystallinity and used for the fabrication of light-emitting diodes (LEDs), laser diodes (LDs) and electronic devices and to a method for the fabrication thereof. It particularly relates to a method for the fabrication of a Group III nitride semiconductor ideally usable for enabling a Group III nitride semiconductor of excellent crystallinity to be epitaxially grown on a sapphire substrate.

BACKGROUND ART

The Group III nitride semiconductor has been being reduced to commercial products, such as LEDs and LDs, because it possesses a direct transition-type band gap of energy corresponding to a region extending from visible light to ultraviolet light and allows highly efficient luminescence. It further has the potential for acquiring such characteristic properties of an electronic device as the conventional Group III-V compound semiconductor fails to acquire, as evinced by forming in the heterojunction interface between aluminum gallium nitride (AlGaN) and gallium nitride (GaN) a two-dimensional electron layer due to a piezoelectric effect characteristic of a Group III nitride semiconductor.

A large lattice mismatching exists between the material generally used as the substrate for growing a Group III nitride semiconductor and a Group III nitride semiconductor. For example, a lattice mismatching of 16% exists between sapphire ($Al_2O_3$) and gallium nitride (GaN) and a lattice mismatching of 6% exists between SiC and gallium nitride. Generally, when such a large lattice mismatching as these exists, it is difficult to attain epitaxial growth of a crystal directly on a substrate. Even when the growth is attained, a crystal of excellent crystallinity is not obtained. When the Group III nitride semiconductor crystal is epitaxially grown on a sapphire single crystal substrate or a SiC single crystal substrate by the method of metal organic chemical vapor deposition (MOCVD), therefore, a method which comprises first depositing on a substrate a layer formed of aluminum nitride (AlN) or AlGaN and called a low-temperature buffer layer and epitaxially growing thereon a Group III nitride semiconductor crystal at an elevated temperature has been generally adopted (refer to Japanese Patent No. 3026087 and JP-A HEI 4-297023).

Besides the method of growth adopting the low-temperature buffer layer mentioned above, a method which comprises forming on a substrate an AlN layer grown at an elevated temperature in the approximate range of 900° C. to 1200° C. and growing gallium nitride thereon has been disclosed (refer, for example, to JP-A HEI 9-64477 and P. Kung, et al., Applied Physics Letters, 66 (1995), p. 2958).

Further, a method of fabricating a Group III nitride semiconductor crystal layer stacked structure using as a buffer a Group III nitride semiconductor fabricated using a Group V/III element ratio of 1000 or less has been disclosed (refer to JP-A 2003-243302).

At 400° C. to 600° C. as temperatures for the deposition of a low-temperature buffer layer, the organic metal raw material or the nitrogen source, particularly ammonia used as a nitrogen source, undergoes no sufficient thermal decomposition. The low-temperature buffer layer deposited at such low temperatures contains defects copiously in its unaltered form. Since the raw material is subjected to a reaction at a low temperature, the reaction entails polymerization as between the alkyl group of the organic metal of the raw material and the undecomposed nitrogen source, and the impurity resulting from this reaction is copiously contained in the crystal of the low-temperature buffer layer.

It is the process of heat treatment called the crystallization of a low-temperature buffer layer that is resorted to for the elimination of such defects and impurity. The process for crystallizing the buffer layer effects the removal of the impurity and defects copiously contained in the low-temperature buffer layer by subjecting this low-temperature buffer layer to a heat treatment performed at elevated temperatures approximating closely to the temperature for the epitaxial growth of the Group III nitride semiconductor crystal.

In contrast with the method of growth using this low-temperature buffer layer, the method which, as disclosed in "P. Kung, et al., Applied Physics Letters, 66 (1995), p. 2958" mentioned above, comprises forming on a substrate AlN grown at elevated temperatures in the approximate range of 900° C. to 1200° C. and then growing gallium nitride thereon has been available. This prior art contains a mention to the effect that this method is capable of fabricating a veritably excellent crystal describing an X-ray locking curve of 30 arcsec on the (0002) plane. A double check of this process has resulted in yielding a gallium nitride crystal film formed of a crystal having a very high column forming property and containing numerous grain boundaries. The crystal of this quality contains threading dislocations occurring from the substrate toward the surface at a high density. When this product is fabricated into a device configuration of a light-emitting device or an electronic device, therefore, the device does not acquire satisfactory characteristic properties.

A method for growth which uses an AlN layer fabricated similarly at elevated temperatures is also disclosed in JP-A HEI 9-64477. As described in this document, the Group III nitride semiconductor crystal to be fabricated is preferred to be a single crystal excelling in crystallinity. In spite of a repeated double check, the method for growth using an excellent single crystal AlN film as described in this prior art, similarly to the method described in the preceding prior art, has not been found to grow such a crystal as fabricating a device structure and acquiring ideal characteristic properties. This failure may be logically explained by a supposition that when the layer of a single crystal excelling in crystallinity is used as a buffer layer and a Group III nitride semiconductor is subsequently grown on the buffer layer, the atoms adhering to the buffer layer during the initial stage of the growth are not smoothly migrated and are not allowed to attain two-dimensional growth easily.

Since the Group III nitride semiconductor crystal possessing crystallinity sufficient to fabricate a device cannot be obtained as described above, the method for growing a Group III nitride semiconductor crystal using an AlN buffer layer grown at elevated temperatures is not quite popular at present.

The technique of forming an AlN film under the condition of restricting the V/III ratio to 1000 or less as disclosed in JP-A 2003-243302 is indeed capable of suppressing an electric power consumed and allaying the warping of the substrate and nevertheless entails the problem that the GaN formed thereby on the AlN film is deficient in crystallinity.

This invention is aimed at developing a method for fabricating a Group III nitride semiconductor crystal, particularly a GaN crystal, exhibiting further excellent crystallinity based on the technique disclosed in JP-A 2003-243302, namely at providing a method for fabricating the crystal of a Group III nitride semiconductor, such as GaN, of excellent crystallinity without requiring to set many temperature ranges or necessitating an excess electric power.

DISCLOSURE OF THE INVENTION

To attain the above object, the present invention provides as the first aspect thereof a method for the fabrication of a Group III nitride semiconductor comprising the steps of installing a substrate in a reaction vessel, forming a Group III nitrogen semiconductor on the substrate, causing a solid nitrogen compound to exist in the reaction vessel as a nitrogen source for a Group III nitride semiconductor and supplying a raw material gas as a source for a Group III element into the reaction vessel to fabricate the Group III nitride semiconductor.

In the second aspect of the invention that includes the first aspect thereof, the solid nitrogen compound has a temperature lower than a temperature of the substrate by 400° C. or more.

In the third aspect of the invention that includes the first aspect thereof, the solid nitrogen compound has a temperature in a range of 200° C. to 700° C.

In the fourth aspect of the invention that includes any one of the first to third aspects thereof, the solid nitrogen compound contains one or more members selected from the group consisting of aluminum, gallium and indium.

In the fifth aspect of the invention that includes any one of the first to fourth aspects thereof, the solid nitrogen compound is GaN.

In the sixth aspect of the invention that includes any one of the first to fourth aspects thereof, the solid nitrogen compound is AlN.

In the seventh aspect of the invention that includes any one of the first to sixth aspects thereof, the reaction vessel is provided therein with a base material containing at least one member selected from the group consisting of quartz, carbon, silicon carbide, silicon, silicon nitride, aluminum nitride, boron nitride, magnesium oxide, zirconium oxide, Mo, Ta, W, Ti, B, Ni, Pt, Zr, Ir, V, Fe and Cr, and the solid nitrogen compound exits on the base material.

In the eighth aspect of the invention that includes the seventh aspect thereof, the solid nitrogen compound existing on the base material is a precipitation formed on a surface of the base material by evaporation, decomposition or reaction.

In the ninth aspect of the invention that includes any one of the first to eighth aspects thereof, the solid nitrogen compound is separated from the substrate at a distance of within 5 cm.

In the tenth aspect of the invention that includes any one of the first to ninth aspects thereof, the substrate is formed of one member selected from the group consisting of sapphire ($Al_2O_3$), SiC, Si and Group III-V compound semiconductors.

In the eleventh aspect of the invention that includes any one of the first to tenth aspects thereof, the step of forming the Group III nitride semiconductor on the substrate is a step of forming a buffer layer on the substrate.

In the twelfth aspect of the invention that includes the eleventh aspect thereof, the buffer layer is formed of GaN or AlN.

The present invention provides as a thirteenth aspect thereof a Group III nitride semiconductor obtained by the method for the production of a group III nitride semiconductor according to any one of the first to twelfth aspects thereof.

According to this invention, a buffer layer, such as of AlN, excelling in crystallinity can be formed on a substrate and a Group III nitride semiconductor, such as of GaN which is formed thereon also is enabled to excel in crystallinity.

The above and other objects, characteristic features and advantages of the present invention will become apparent to those skilled in the art from the description made herein below with reference to the accompanying drawings.

BEST MODE FOR CARRYING OUT THE INVENTION

This invention concerns a method for the fabrication of a Group III nitride semiconductor, which is characterized by supplying a Group III element-containing compound as one of the raw material gas into a reaction vessel, allowing a solid nitrogen compound as another nitrogen source to be present in the reaction vessel and utilizing the nitrogen which is produced in consequence of the decomposition thereof. The raw material gas may be selected from among the known raw material gases which are available herein.

Now, this invention will be described in detail below with reference to the accompanying drawings.

Figure 1:
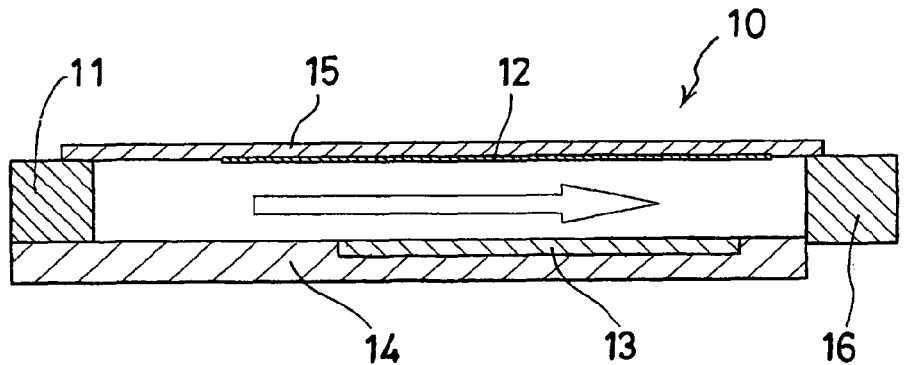
FIG. 1 is a schematic view illustrating the concept a device for fabricating the Group III nitride semiconductor described in Example 1.

FIG. 1 is a cross-sectional view illustrating one example of the reaction vessel to be used for this invention.

In FIG. 1, reference numeral 10 denotes a reaction vessel, numeral 11 a raw material gas inlet port and numeral 16 an exhaust port. These component parts are furnished with a pipe line which is not shown. Reference numeral 14 denotes a base plate and numeral 15a top plate. The reaction vessel is provided, though not illustrated, on the opposite sides thereof with side plates. Reference numeral 13 denotes a substrate and numeral 12a solid nitrogen compound-retaining base material (occasionally referred to simply as a base material hereinafter).

The solid nitrogen compound contains nitrogen therein because it is a nitrogen source for the Group III nitride semiconductor crystal. Further, for the purpose of inhibiting the introduction of an impurity into the reaction vessel, the solid nitrogen compound is preferred to be prepared as a compound of aluminum, gallium and indium. When the solid nitrogen compound is prepared as GaN or AlN, it will be at an advantage in allowing ideal control of decomposition. Particularly, by having GaN as a main component, it will be at an advantage in permitting stable supply of nitrogen without impairing crystallinity.

The solid nitrogen compound may be in a form adhering to the component members in the reaction vessel, i.e. in the form of a precipitate. The term "precipitate" refers to a solid deposit produced by the decomposition, evaporation, reaction, etc. of a raw material because the component members in a reaction vessel reach an elevated temperature during the growth of a crystal by the use of the reaction vessel. When the semiconductor layer so deposited is continuously subjected to crystal growth by the use of the same reaction vessel, the precipitate resulting from the previous crystal growth adheres fast to the inside wall of the reaction vessel and this adhering precipitate can be utilized as a solid nitrogen compound.

The method for inducing the presence of a solid nitrogen compound inside the reaction vessel does not need to be particularly restricted. A method for attaching the solid nitrogen compound to the top plate, the base plate or the side plate of the reaction vessel and a method for mounting the solid nitrogen compound on a supporting base on which a substrate is supported at stated intervals from the substrate, for example, are available. When the compound is attached to the top plate or mounted on the substrate, a base material 12 having fastened in advance thereto the solid nitrogen compound may be used and installed on the top plate or the substrate.

The base material occupies a position opposite the substrate and preferably assumes the shape of a flat surface which is capable of effecting uniform and efficient supply of nitrogen. This position is generally on the top plate when the reaction vessel is in the type of installing the substrate horizontally. It is on the base plate when the reaction vessel is in the so-called face-down-type of setting the substrate with the growing face turned downwardly.

The base is preferred to have the surface thereof coarsened in advance so as to facilitate retention of the precipitate. The coarseness of the surface is appropriate in the approximate range of 1 to 10 in the magnitude of Ra. When the coarseness is 5 or more and 8 or less, the retention of the precipitate can be accomplished most ideally. The measurement of Ra may be performed by visual observation with an optical microscope or by visual observation with an electron microscope. Besides, commercially available measuring instruments, such as a feeler type measuring instrument and an optical measuring instrument are available for the measurement.

The base material is preferred to be formed of a material possessing a heat resisting property and a corrosion resisting property. For the base material, for example, a component member containing at least one member selected from the group consisting of quartz, carbon, silicon carbide, silicon, silicon nitride, aluminum nitride, boron nitride, magnesium oxide, zirconium oxide, Mo, Ta, W, Ti, B, Ni, Pt, Zr, Ir, V, Fe and Cr is available. Among other substances enumerated above, ceramic materials, such as quartz, carbon and silicon carbide, and high melting metals, such as Mo, Ta, W, Ti, Ni and V prove particularly advantageous.

The solid nitrogen compound in the reaction vessel is preferably located near the substrate which is expected to form the Group III nitride semiconductor. Specifically, the minimum distance between them is within 5 cm.

The base material is also preferred to be in a construction permitting control of temperature as a function for the control of the retention and supply of a raw material.

Since the substrate for the growth necessitates an elevated temperature of 800° C. or more, the control of temperature of the base material basically consists in cooling the base material. When the base material is adopted as the supporting base for the substrate of growth, it is not easily enabled to acquire the function of cooling. In the reaction vessel of the type designed to mount the substrate so that the surface for the growth may be turned upwardly, the base material can be positioned near the substrate and can be easily cooled and, therefore, proves advantageous.

As regards the method for cooling, the common water cooling and the air cooling using a gas can be adopted. A liquid excelling in thermal conductivity and a liquid having a low solidifying point may be used as a coolant.

As the substrate for the deposition of the Group III nitride semiconductor, sapphire, SiC, Si and Group III-V compound semiconductor substrate which are in popular use are available. Among other substrates enumerated above, sapphire particularly allows easy handling because it can be procured inexpensively and can be manufactured into chips by an established technique. It is further at an advantage in allowing manufacture into flip chips and promoting acquisition of an enhanced output on account of the quality of transparency.

The raw material for this invention is preferred to have a V/III element ratio of 800 or less. This V/III element ratio more preferably is in the range of 1 to 500. For the purpose of fulfilling this requirement, generally the temperature of the solid nitrogen compound is in the range of 200° C. to 700° C. and/or the temperature of the solid nitrogen compound is lower than the temperature of the substrate by 400° C. or more. The former temperature is preferably in the range of 400° C. to 600° C. and the latter temperature is lower than the temperature of the substrate preferably by 600° C. or more and still more preferably by 800° C. or more. The temperature of the solid nitrogen compound is lower than the temperature of the substrate. If the difference of temperature between them falls short of 400° C., the shortage will possibly result in inducing re-adsorption of the decomposed nitrogen compound to the substrate. The deviation of the temperature of the solid nitrogen compound from the range of 200° C. to 700° C. is disadvantageous; specifically the temperature falling short of 200° C. will result in preventing the nitrogen compound from being decomposed sufficiently and the temperature exceeding 700° C. will result in inducing separation of a metal.

When a buffer layer is formed as of AlN in accordance with the method of fabrication contemplated by this invention, the GaN which is consequently formed thereon excels the GaN described in JP-A 2003-243302 in crystallinity for some inexplicable reason.

In this invention, as the Group III raw material which is supplied as a main raw material, a compound possessing a molecular structure having an alkyl group linked to a metallic atom and called an organic metal compound is used. This compound is easy to procure and handle and has been in popular use. As concrete examples of this compound, trimethyl aluminum, triethyl aluminum, tertiary butyl aluminum, trimethyl gallium, triethyl gallium, tertiary butyl gallium, trimethyl indium, triethyl indium, tertiary butyl indium and cyclopentadienyl indium may be cited. When the Group III raw material contains at least Al like trimethyl aluminum, triethyl aluminum or tertiary butyl aluminum, it is particularly at an advantage in acquiring an effect of discouraging induction of decomposition or sublimation even at elevated temperatures and facilitating growth of a crystal on the substrate because the aluminum-containing nitride has a high decomposition temperature. Among other aluminum-containing Group III raw materials enumerated above, trimethyl aluminum is particularly easy to use because it has a high vapor pressure.

By using these raw materials and a solid nitrogen compound, a layer of AlN, GaN or InN (a buffer layer) is formed on the substrate (first step). The solid nitrogen compound which is used appropriately in this case is a nitride of the element destined to be contained in the fabricated compound semiconductor in the sense of preventing the reaction vessel interior from contamination. Specifically, InN, AlN, GaN, AlGaN, InGaN, AlInGaN and SiN are concrete examples. In these combinations, the most preferable is what forms an AlN layer on a substrate by using as a solid nitrogen compound a compound containing Ga, Al or In.

A Group III nitride semiconductor layer is formed on the AlN, etc. (second step). This Group III nitride semiconductor layer is preferably formed of GaN or AlGaN, particularly of GaN. When this GaN happens to contain a dopant, the dopant possibly impedes migration during the initial stage of growth of crystal and obstructs formation of an excellent crystal. That is, the layer directly on the buffer layer is preferred to be in an undoped state. The second and following steps can be performed by using a known method.

By supplying a Group III raw material alone as a main raw material from the exterior of a reaction vessel and effecting supply of nitrogen as a solid nitrogen compound from the interior of the reaction vessel, it is made possible to obtain the formed Group III nitride semiconductor crystal in the form of a mass of islandlike crystals or an aggregate of columnar crystals. The mass of islandlike crystals or the aggregate of columnar crystals thus obtained effectively functions as a buffer during the growth of a Group III nitride semiconductor crystal on a single crystal substrate.

The fact that the AlN film manufactured at a small V/III element ratio is preferably for the purpose of growing an excellent Group III nitride semiconductor is described also in JP-A HEI 9-64477. This prior art, however, contains a mention to the effect that the produced Group III nitride semiconductor crystal is preferably a single crystal excelling in crystallinity. We have been ascertained by repeating an experiment and an analysis that an aggregate of columnar crystals or islandlike crystals functions as a more favorable buffer layer than a film of single crystal. This superiority may be logically explained by a supposition that the columnar crystals or the islandlike crystals enable the Group III nitride semiconductor crystal grown directly thereon to effect dislocation in a looped form.

Particularly when the buffer layer constitutes an aggregate of columnar crystals of AlN, the lateral faces of the crystals are preferably in a shape approximately perpendicular to the surface of the substrate. The method contemplated by this invention enables such an AlN buffer layer to be manufactured easily and stably. The surface of the buffer layer may be flat or concavo-convex.

The buffer layer thus formed may be subjected to a doping treatment. In the electrically conductive substrate of SiC, for example, the impartation of electric conductivity to the buffer layer results in enabling the stacked structure to pass an electric current in the longitudinal direction. Since the dopant used for the doping treatment is capable of altering the mode of crystals, the method mentioned above is effective also in an insulating substrate, such as sapphire.

The dopant for the doping treatment may be an n-type impurity or a p-type impurity. Si, Ge, Sn, Se, S and Te have been known as n-type impurities. Among other dopants enumerated above, Si, Ge and Sn prove particularly preferable because they are easy to handle. Mg, Zn and C have been known as p-type dopants. Mg and Zn prove particularly preferable because they are comparatively easy to handle and inexpensive.

This invention prefers the temperature of the substrate to be in the approximate range of 800° C. to 1500° C. In this case, the temperature of the base material is preferably in the range of 200° C. to 700° C. The temperature of the base material, therefore, is controlled so as to fall in the range just mentioned.

Further, the temperature difference between the base material and the surface of the substrate is preferred to be 400° C. or more. The base material, therefore, is cooled so as to reach a temperature falling in this range. More preferably, the temperature of the base material is in the range mentioned above and the temperature difference mentioned above is 400° C. or more as well.

The distance between the substrate and the base material is preferred to allow a certain degree of adjustment. Particularly when the shortest distance can be adjusted to within 5 cm, it is made possible to seek out the conditions promising stability.

The fact that the base material is endowed with such a temperature adjusting mechanism is important for the purpose of obtaining excellent columnar crystals. Even in the absence of this mechanism, the manufacture of columnar crystals can be realized by adjusting the temperature and the duration of thermal cleaning. It is, however, difficult to obtain such crystals with a stably excellent quality.

This invention can use a sole gas of hydrogen or rare gas or a mixed gas as the ambient gas. It is preferable to use hydrogen as a carrier gas because the hydrogen gas of high purity can be obtained comparatively easily.

The pressure of the atmosphere for this invention is $1 \times 10^5$ Pa or less and is preferably in the range of 1000 to $1 \times 10^5$ Pa and more preferably in the range of 1000 to $10^4$ Pa. When this pressure is low, it brings an effect of flattening the surface of the metal-excess Group III nitride semiconductor layer to be fabricated and tending to flatten the surface of the second Group III nitride semiconductor layer to be grown thereon.

This invention does not particularly define the temperature of the substrate during the formation of a buffer layer (first step) and the temperature of the substrate during the subsequent formation of a film (second step). The temperature of the substrate during the course of the first step is preferred to be equal to or higher than the temperature of the substrate during the subsequent course of the second step. When the first step is carried out at a temperature equal to or higher than the temperature of the substrate during the course of the second step, this practice is at an advantage in enabling the decomposition of the organic metal compound molecules forming the Group III raw material gas to proceed efficiently and preventing the formed crystal from being adulterated with an impurity, such as the unaltered alkyl group.

The Group III nitride semiconductor to be formed in the first step of this invention may be allowed to form a mass of islandlike crystals as by altering the conditions for performing the first step. Specifically, the alteration is effected by lowering the pressure in the reaction vessel used for performing the first step, curtailing the duration of the first step, lowering the flow rate of TMAl, doping a dopant or incorporating nitrogen into the carrier gas, for example. The mass consequently obtained is an aggregate of lumps of islandlike crystals approximately measuring 1 nm to 500 nm in width and 5 nm to 100 nm in height. This aggregate may be in such a structure that the distribution of islandlike crystals is not appreciably dense and the surface of the substrate is exposed through the gaps intervening between the lumps of crystals. In this case, since the regions differing in the speed of growth of crystal occur in a mixed state on the surface, the effect of selective growth reduces the density of threading dislocation and enables crystals of more satisfactory quality to be manufactured.

Otherwise, the Group III nitride semiconductor to be formed in the first step of this invention may be allowed to form columnar crystals by altering the conditions for performing the first step. Specifically, this alteration may be effected by increasing the pressure in the reaction vessel for performing the first step, elongating the duration of the first step, increasing the flow rate of TMAl or increasing the ratio of hydrogen in the carrier gas, for example. The columnar crystals which are formed by the aggregation of columnar grains approximately measuring 0.1 nm to 100 nm in width and 10 nm to 500 nm in height excel in crystallinity.

In the second step of this invention, a Group III nitride semiconductor crystal is grown in the vapor phase by using a Group III raw material and a nitrogen raw material on the substrate which has formed thereon the Group III nitride in the first step. When the Group III nitride semiconductor crystal to be grown is GaN, the GaN proves particularly advantageous among other Group III nitride semiconductors because it easily attains two-dimensional growth and easily gives rise to a flat crystal film. Once a flat and excellent crystal film is formed in advance of GaN, it permits easy fabrication thereon of a semiconductor device structure using a Group III nitride semiconductor crystal layer of a varying composition.

In the first step, the second step, or both these steps of this invention, the method of metal organic chemical vapor deposition (MOCVD method) or the method of vapor phase epitaxy (VPE method) can be used as the method for vapor-phase growth. In these methods, the MOCVD method proves advantageous because it permits adjustment of the speed of decomposition of the Group III raw material and exhibits proper speed of growth. Further, by the MOCVD method, a varying device structure possessing excellent characteristic properties is enabled to be fabricated on the crystal without requiring taking the flattened substrate out of the reaction vessel.

The temperature of the substrate during the growth of the Group III nitride semiconductor crystal by the MOCVD method in the second step is preferably in the range of 950° C. to 1200° C. and the pressure of the atmosphere is preferably in the range of 1000 Pa to $1 \times 10^5$ Pa.

No ammonia ($NH_3$) is used in the first step. As the nitrogen raw material required for the second step, ammonia ($NH_3$) may also be usable. As the Group III raw material, trimethyl aluminum, triethyl aluminum, tertiary butyl aluminum, trimethyl gallium, triethyl gallium, tertiary butyl gallium, trimethyl indium, triethyl indium, tertiary butyl indium and cyclopentadienyl indium are available. The V/III element ratio during the growth of the Group III nitride semiconductor crystal in the second step is preferably in the range of 500 to 20000.

By the method for the production of the Group III nitride semiconductor crystal contemplated by this invention, a Group III nitride semiconductor crystal having high uniformity and excelling in crystallinity can be formed on the substrate. By further forming the Group III nitride semiconductor crystal layer on the aforementioned Group III nitride semiconductor crystal, therefore, it is made possible to fabricate a Group III nitride semiconductor epitaxial wafer having a stacked structure and used for the fabrication of a light-emitting diode, a laser diode or an electronic device.

By using the technique of growth according to this invention, it is made possible to obtain a gallium nitride-based compound semiconductor light-emitting device having a high emission intensity. That is, since this technique is capable of fabricating an LED lamp of high luminance, electronic devices, such as portable telephones, displays and panels, which incorporate therein chips fabricated by this technique and machine devices, such as automobiles, computers and game machines, which incorporate therein such electronic devices can be driven with a low electric power and enabled to exhibit high characteristic properties. Battery-driven machines, such as portable telephones, game machines, toys and automobile parts, consequently manifest an effect of enabling their batteries to offer an elongated service life.

Now, this invention will be specifically described below with reference to examples.

EXAMPLE 1

A conceptual cross section of a device used herein is illustrated in FIG. 1.

The raw material formed by mixing the vapor of trimethyl aluminum (TMAl) and hydrogen was fed in a flow into a reaction vessel 10 via a raw material inlet port 11. On a base material 12, a precipitate of GaN was deposited in advance by epitaxial growth. As a solid nitrogen compound, the base material 12 made of quartz and given a surface-coarsening treatment in advance was mounted on a top plate 15 in parallel at a position of 2 cm from the surface of a substrate 13 and retained at 500° C. (the solid nitrogen compound kept at the same temperature) by means of a temperature adjusting mechanism to induce supply of nitrogen atoms. The substrate 13 formed of sapphire was installed on a base plate 14. The substrate was kept at 1170° C. to induce growth of columnar crystal of aluminum nitride in a film 40 nm in thickness. For a second step, TMGa and ammonia were fed in a flow to induce growth of gallium nitride. On the aluminum nitride layer, a GaN layer formed of gallium nitride crystal was manufactured.

The manufacture of a sample containing the GaN layer mentioned above was carried out in the following procedure using the MOCVD method.

First, for the purpose of causing a precipitate to adhere to the base material 12, the epitaxial growth was effected omitting the introduction of a substrate. As a result, a precipitate formed mainly of GaN and assuming a black color adhered to the base material.

The reaction vessel was left cooling to room temperature, and the sapphire substrate was subsequently introduced into the reaction vessel made of quartz and installed in a RF coil of an induction heater. The sapphire substrate was mounted on the base plate 14 made of carbon and used for heating inside a glove box having the interior already displaced with nitrogen gas. Further, the base material 12 to which the precipitate had adhered was installed on the lower surface of the top plate so as to assume a position about 2 cm above the substrate 13.

The induction heater was set operating to elevate the temperature of the substrate to 600° C. The substrate kept at the temperature of 600° C. was left standing at rest for a prescribed time while the supply of the hydrogen gas in a flow was continued. In this while, a hydrogen carrier gas was supplied in a flow through a pipe line communicating with a container (bubbler) filled with trimethyl gallium (TMGa) as a raw material and a container (bubbler) filled with trimethyl aluminum (TMAl) both connected to the reaction vessel to induce the operation of bubbling. The temperature of each of the bubblers was adjusted in advance to a fixed level by means of a constant temperature bath intended for adjusting temperature. The vapors of TMGa and TMAl generated by the bubbling were continuously advanced together with the carrier gas to the piping for a detoxicating device till the start of the step of growth and then released through the detoxicating device into the ambience.

Thereafter, the valve of the piping for the TMAl was switched to supply the gas containing the vapor of TMAl into the reaction vessel and the first step for performing the adhesion of the Group III nitrogen semiconductor to the sapphire substrate was started.

The temperature of the substrate was set at 1170° C. and hydrogen was used as the carrier gas. As the main raw materials to be supplied, nitrogen and a nitrogen compound were not supplied.

After the elapse of several minutes, the supply of the gas containing the vapor of TMAl to the interior of the reaction vessel was discontinued and the reaction vessel was left standing in the ensuing state. In this while, the temperature of the base material was adjusted to 500° C. by means of a temperature adjusting function and the precipitate of GaN of the base material as a solid nitrogen compound was decomposed and the nitrogen atom consequently formed was supplied to the substrate. After the formation of an AlN buffer, the flow of the TMAl was discontinued, the interior of the reaction vessel was left standing per se, and the TMAl was completely expelled from the reaction vessel.

Subsequently, the valve of the pipe line for ammonia gas and the valve of the pipe line for TMGa were switched to induce supply of the ammonia gas and the TMGa gas to the interior of the reaction vessel and initiate the growth of GaN. Between ammonia and TMGa, the flow of ammonia was started first.

After the growth of the GaN layer was effected, the valve of the pipe line for TMGa was switched to terminate the supply of the raw material to the reaction vessel and discontinue the growth. In this while, the temperature of the base material was retained at 250° C. by means of a temperature adjusting function for the purpose of enabling the GaN precipitate as a solid nitrogen compound of the subsequent growth to adhere uniformly to the base material.

After the growth of the GaN layer was completed, the conduction of electricity to the induction heater was stopped and the temperature of the substrate was allowed to fall to room temperature. Thereafter, the sample was taken out in the ambient air while the flow of the nitrogen gas was continued.

By the step described above, the AlN layer having a structure formed of an aggregate of columnar crystals was formed on the sapphire substrate and a sample forming a GaN layer of a film thickness of 8 μm thereon in an undoped state was manufactured.

Then, the undoped GaN layer grown by the foregoing method was tested for the X-ray rocking curve (XRC). This test was performed on the (0002) plane as the plane of symmetry and on the (10-10) plane as the plane of asymmetry by using a Cu β-ray X-ray emitting device was used as a light source. Generally, in the case of the gallium nitride-based compound semiconductor, the XRC spectrum half-value width of the (0002) plane constitutes the index of the flatness (mosaicity) of a crystal and the XRC spectrum half-value width of the (10-10) plane the index of the dislocation density (twist). As a result of the test, the undoped GaN layer manufactured by the method of this invention was found to have a half-value width of 180 seconds in the measurement on the (0002) plane and a half-value width of 300 seconds in the measurement on the (10-10) plane.

The outermost surface of the aforementioned GaN layer was visually observed by the use of a common atomic force microscope (AFM). As a result, the surface showed no growth pit and revealed excellent morphology. When the cross section of the sample was observed with a transmission electron microscope (TEM), an AlN film possessing numerous grain boundaries in a direction approximately perpendicular to the surface of the substrate was observed in the interface between the sapphire substrate and the gallium nitride layer. The film thickness was about 40 nm and the distance between the adjacent grain boundaries was 5 nm to 30 nm. This layer was thought to be a layer formed of aggregates of columnar crystals.

EXAMPLE 2

In Example 2, an experiment was performed by substantially following the procedure of Example 1 while forming the base material 12 of Mo during the growth of the Group III nitride semiconductor in the first step. The wafer taken out of the reaction vessel in this case had a specular surface and was colorless and transparent.

When the cross section of this sample was observed with a transmission electron microscope (TEM), the presence of masses of islandlike AlN crystals in the interface between the sapphire substrate and the gallium nitride layer was confirmed.

The undoped GaN layer manufactured by this method showed a half-value width of 200 seconds in the measurement on the (0002) plane and a half-value width of 350 seconds in the measurement on the (10-10) plane.

EXAMPLE 3

Figure 2:
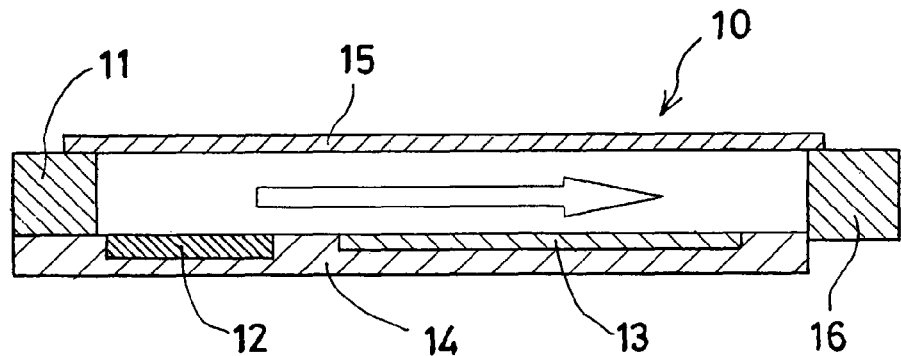
FIG. 2 is a schematic view illustrating the concept of a device for fabricating the Group III nitride semiconductor described in Example 3.

In Example 3, the growth was performed by using a device having the base material 12 mounted on the base plate 14 as illustrated in FIG. 2. The base plate 14 was formed of a material obtained by coating the surface of a member made of carbon with silicon carbide. The base material 12, though not having a cooling function, had a GaN precipitate of a proper thickness deposited in advance thereon and superheated by the induction heating which additionally heated the base plate itself so that the decomposition of the precipitate might serve the purpose of supplying nitrogen atoms. The distance between the base material 12 and the substrate 13 (the distance between the right edge of the base material 12 and the left edge of the substrate 13) was 20 mm.

In this case, the wafer taken out of the reaction vessel had a specular surface and was colorless and transparent.

When the cross section of this sample was observed with a transmission electron microscope (TEM), the presence of masses of islandlike AlN crystals in the interface between the sapphire substrate and the gallium nitride layer was confirmed.

The undoped GaN layer manufactured by this method showed a half-value width of 240 seconds in the measurement on the (0002) plane and a half-value width of 320 seconds in the measurement on the (10-10) plane.

Comparative Example

In this comparative example, an AlN buffer was formed by feeding $NH_3$ and TMAl in accordance with an ordinary method. Thereafter, the experiment was performed by following the procedure of Example 1. The wafer taken out of the reaction vessel had a specular surface. As a result of the cross-section TEM observation, the buffer layer grown by the first step was found to be a layer of single crystals possessing a flat surface. The growth failed to form columnar crystals of excellent quality.

The undoped GaN layer manufactured by this method showed a half-value width of 500 seconds in the measurement on the (0002) plane and a half-value width of 400 seconds in the measurement on the (10-10) plane.

By the experiment, it was ascertained that as a material for forming a solid nitrogen compound-retaining member, a highly heat-resistant material containing at least one member selected from among Ta, W, Ti, B, Ni, Pt, Zr, Ir, V, Fe and Cr was useful. The retention of nitrogen was attained by the precipitation on the surface of the constituent member. It is surmised that a material of low heat resistance, even in the presence of a temperature adjusting mechanism, suffered the component member itself to incur ready melting of the outermost surface and encountered difficulty in shedding a deposit on the surface.

EXAMPLE 4

Figure 3:
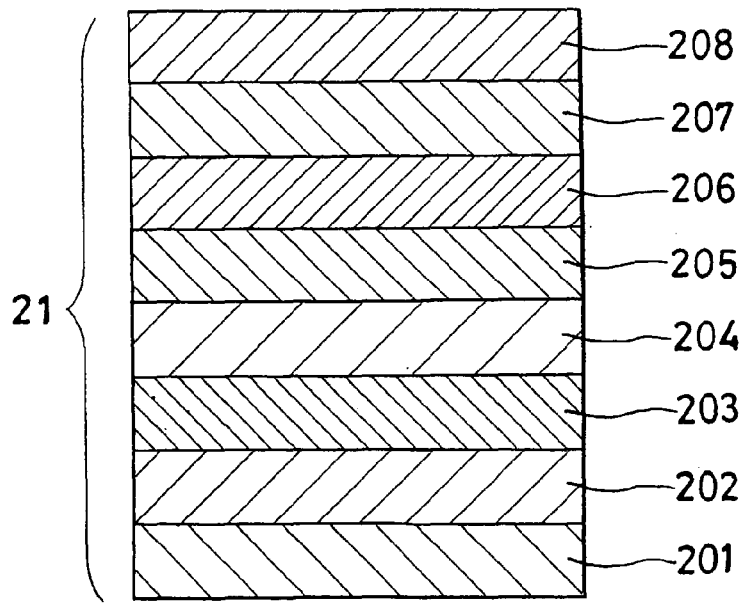
FIG. 3 is a diagram of the LED stacked structure described in Examples 4 and 5.

In Example 4, an LED 21 was produced by using as an under layer an undoped GaN of a thickness of 8 μm manufactured by a step similar to the procedure of Example 1. The cross section of this LED 21 is shown in FIG. 3.

A gallium nitride-based compound semiconductor was produced by stacking an under layer 203 having a thickness of 8 μm and formed of an undoped GaN, an Si-doped n-type GaN contact layer 204 having a thickness of 2 μm, an n-type $In_{0.1}Ga_{0.9}N$ clad layer 205 having a thickness of 18 nm, an Si-doped GaN barrier layer having a thickness of 16 nm and an $In_{0.2}Ga_{0.8}N$ well layer having a thickness of 2.5 nm in five cycles on a substrate 201 formed of sapphire via a buffer layer 202 formed of AlN and further stacking thereon a light-emitting layer 206 of a multiple quantum well structure provided with a barrier layer, an Mg-doped p-type $Al_{0.07}Ga_{0.93}N$ clad layer 207 having a thickness of 0.01 μm and an Mg-doped p-type GaN contact layer 208 having a thickness of 0.175 μm sequentially in the order mentioned.

Figure 4:
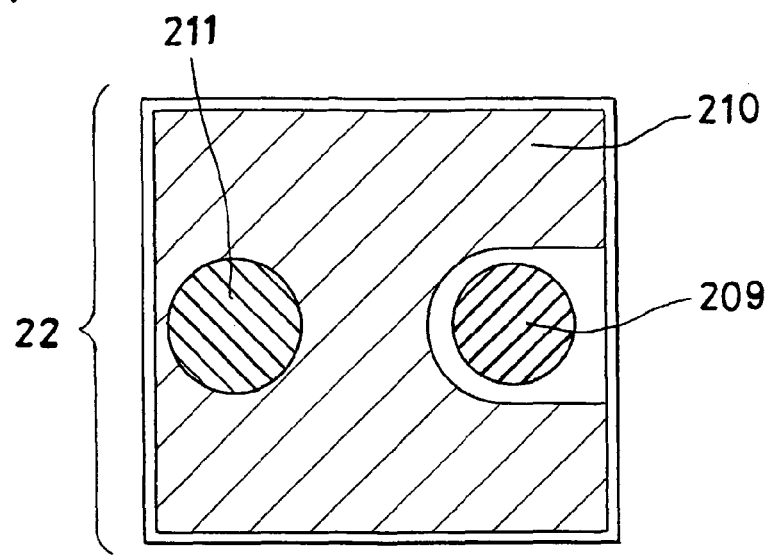
FIG. 4 is a plan view of the electrodes for the LED described in Examples 4 and 5.
Figure 5:
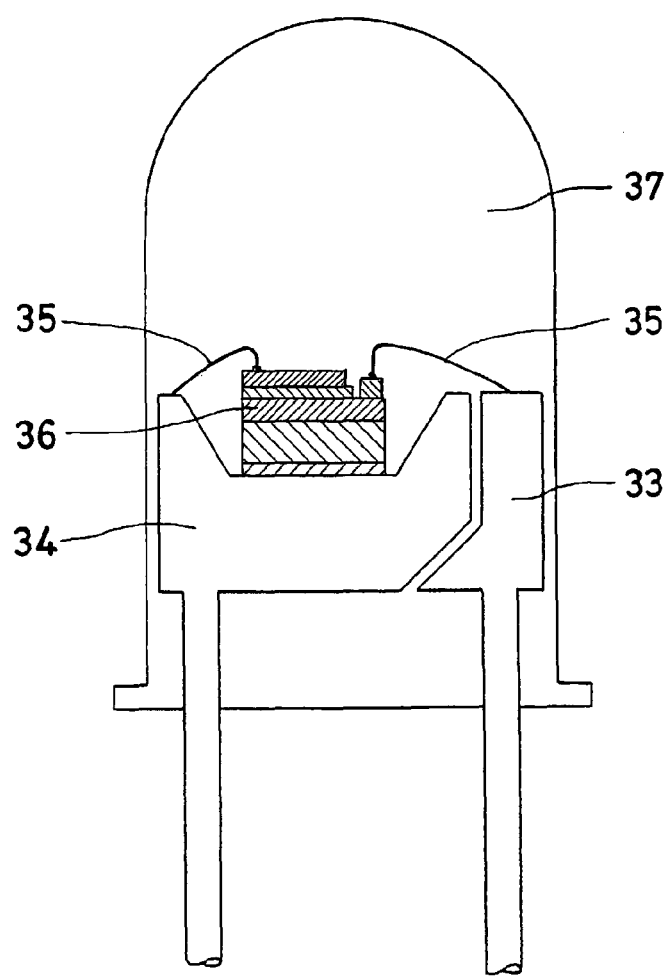
FIG. 5 is a cross-sectional view of the LED lamp described in Example 6.

Further, electrodes were formed on this wafer by using a procedure known to the art. FIG. 4 is a plan view of the configuration of electrodes.

To be specific, a positive electrode comprising a transparent electrode 210 formed of a Pt layer having a thickness of 1.5 nm and an Au layer having a thickness of 5 nm and a five-layer bonding pad electrode 211 formed of an Au layer having a thickness of 50 nm, a Ti layer having a thickness of 20 nm, an Al layer having a thickness of 10 nm, a Ti layer having a thickness of 100 nm and an Au layer having a thickness of 200 nm was formed on a p-type GaN contact layer. Subsequently, a Ti/Au two-layer negative electrode 209 was formed on the n-type GaN contact layer to give rise to a light-emitting device having a light-emitting face on the semiconductor side.

The wafer having the positive and negative electrodes formed as described above had the substrate thereof thinned to 80 μm by abrading and polishing the rear surface of the substrate. The wafer, after having mark-off lines inscribed therein from the semiconductor stacked side by using a laser scriber, was split with pressure and cut into chips each measuring the square of 350 μm. When the chips were subsequently tested for voltage in the forward direction under application of an electric current of 20 mA by conduction of electricity with a probing stylus, the forward voltage was found to be 2.9 V.

When a sample of the chip was mounted in a can package and tested for a light-emitting capacity with a tester, it showed a light-emitting capacity of 5.2 mW at an applied current of 20 mA.

EXAMPLE 5

In Example 5, an LED similar in configuration to the product illustrated in FIG. 3 was manufactured by a process substantially following the procedure of Example 1 while using as an under layer an undoped GaN having a thickness of 8 μm and produced by doping an AlN layer formed in the first step with Ge.

A gallium nitride-based compound semiconductor was produced by stacking an under layer 203 formed of an undoped GaN having a thickness of 6 μm, a Ge-doped n-type GaN contact layer 204 having a thickness of 4 μm, an n-type second clad layer 205a formed of Ge-doped GaN having a thickness of 0.4 μm, an n-type first $In_{0.01}Ga_{0.9}N$ clad layer 205b having a thickness of 18 nm, an Si-doped GaN barrier layer having a thickness of 16 nm and an $In_{0.2}Ga_{0.8}N$ well layer having a thickness of 2.5 nm in five cycles on a substrate 201 formed of sapphire via a buffer layer 202 formed of Ge-doped AlN and further stacking thereon a light-emitting layer 206 of a multiple quantum well structure provided with a barrier layer, an Mg-doped p-type $Al_{0.07}Ga_{0.93}N$ glad layer 207 having a thickness of 0.01 μm and an Mg-doped p-type GaN contact layer 208 having a thickness of 0.175 μm sequentially in the order mentioned.

The wafer thus obtained was divided into LED chips by following the procedure of Example 4. When the chip was tested for voltage in the forward direction under application of an electric current of 20 mA by the conduction of electricity with a probe stylus, the forward voltage was found to be 3.2 V.

When a sample of the chip was mounted in a can package and tested for a light-emitting capacity with a tester, the light-emitting capacity under application of a current of 20 mA was found to be 5.8 mW.

EXAMPLE 6

In Example 6, a lamp was manufactured with the LED chip produced in Example 4.

First, a LED chip 36 was mounted on a second lead frame 34 and fastened thereto with an adhesive agent, with the sapphire substrate side thereof upside down. Then, an n-type ohmic electrode and a first lead frame 33, and a bonding pad and a second lead frame 34 were connected respectively with Au wires 35 so as to permit conduction of a device operation current to the LED chip 36. They were wholly sealed with a transparent epoxy resin 37 and formed in the shape of an LED lamp.

INDUSTRIAL APPLICABILITY

The light-emitting device obtained by using the method of fabrication contemplated by this invention affords light emission of high intensity and, therefore, can be used for portable telephones, displays and panels. Thus, the invention exhibits a very high value for practical industrial application.

The invention claimed is:
1. A method for the fabrication of a Group III nitride semiconductor, comprising the steps of:
    installing a substrate in a reaction vessel;
    causing a solid nitrogen compound to exist in the reaction vessel as a nitrogen source for a Group III nitride semiconductor;
    decomposing the solid nitrogen compound by heat; and
    supplying a raw material gas as a source for a Group III element into the reaction vessel to grow the Group III nitride semiconductor on the substrate.
2. A method according to claim 1, wherein the solid nitrogen compound contains one or more members selected from the group consisting of aluminum, gallium and indium.

3. A method according to claim 1, wherein the solid nitrogen compound is GaN.

4. A method according to claim 1, wherein the solid nitrogen compound is AlN.

5. A method according to claim 1, wherein the reaction vessel is provided therein with a base material containing at least one member selected from the group consisting of quartz, carbon, silicon carbide, silicon, silicon nitride, aluminum nitride, boron nitride, magnesium oxide, zirconium oxide, Mo, Ta, W, Ti, B, Ni, Pt, Zr, Ir, V, Fe and Cr, and the solid nitrogen compound exits on the base material.

6. A method according to claim 5, wherein the solid nitrogen compound existing on the base material is a precipitation formed on a surface of the base material by evaporation, decomposition, or reaction.

7. A method according to claim 1, wherein the solid nitrogen compound is separated from the substrate at a distance of within 5 cm.

8. A method according to claim 1, wherein the substrate is formed of one member selected from the group consisting of sapphire ($Al_2O_3$), SiC, Si and Group III-V compound semiconductors.

9. A method according to claim 1, wherein the step of forming the Group III nitrogen semiconductor on the substrate is a step of forming a buffer layer on the substrate.

10. A method according to claim 9, wherein the buffer layer is formed of GaN or AlN.

\* \* \* \* \*